United States Patent [19]

Epstein et al.

[11] 4,096,477
[45] Jun. 20, 1978

[54] IDENTIFICATION SYSTEM USING CODED PASSIVE TRANSPONDERS

[75] Inventors: Max Epstein, Highland Park; Bernard W. Jordan, Jr., Evanston, both of Ill.

[73] Assignee: Northwestern University, Evanston, Ill.

[21] Appl. No.: 789,952

[22] Filed: Apr. 22, 1977

Related U.S. Application Data

[63] Continuation-in-part of Ser. No. 725,195, Sep. 21, 1976, and Ser. No. 617,251, Sep. 29, 1975, Pat. No. 4,059,831.

[51] Int. Cl.² .................................................. G01S 9/56
[52] U.S. Cl. ................................ 343/6.5 SS; 333/30 R
[58] Field of Search ..................... 343/6.5 SS, 6.8 R; 333/30 R; 310/334

[56] References Cited

U.S. PATENT DOCUMENTS 3,706,094  12/1972  Cole et al. .................... 343/6.5 SS
3,961,290   6/1976  Moore .............................. 333/30 R Primary Examiner—Maynard R. Wilbur
Assistant Examiner—T. M. Blum
Attorney, Agent, or Firm—Kegan, Kegan & Berkman

[57] ABSTRACT

An identification system including a transmitter, a receiver, a decoding subsystem, and a passive transponder identifier. One passive transponder identifier of the invention is a surface acoustic wave device provided with pad means for applying and removing pressure on a substrate of the device at preselected locations. A second identifier of the invention is a microacoustic shear bulk wave device. The passive transponder identifiers are programmed to produce a characteristic coded electronic reply in response to an electromagnetic signal interrogation.

13 Claims, 11 Drawing Figures

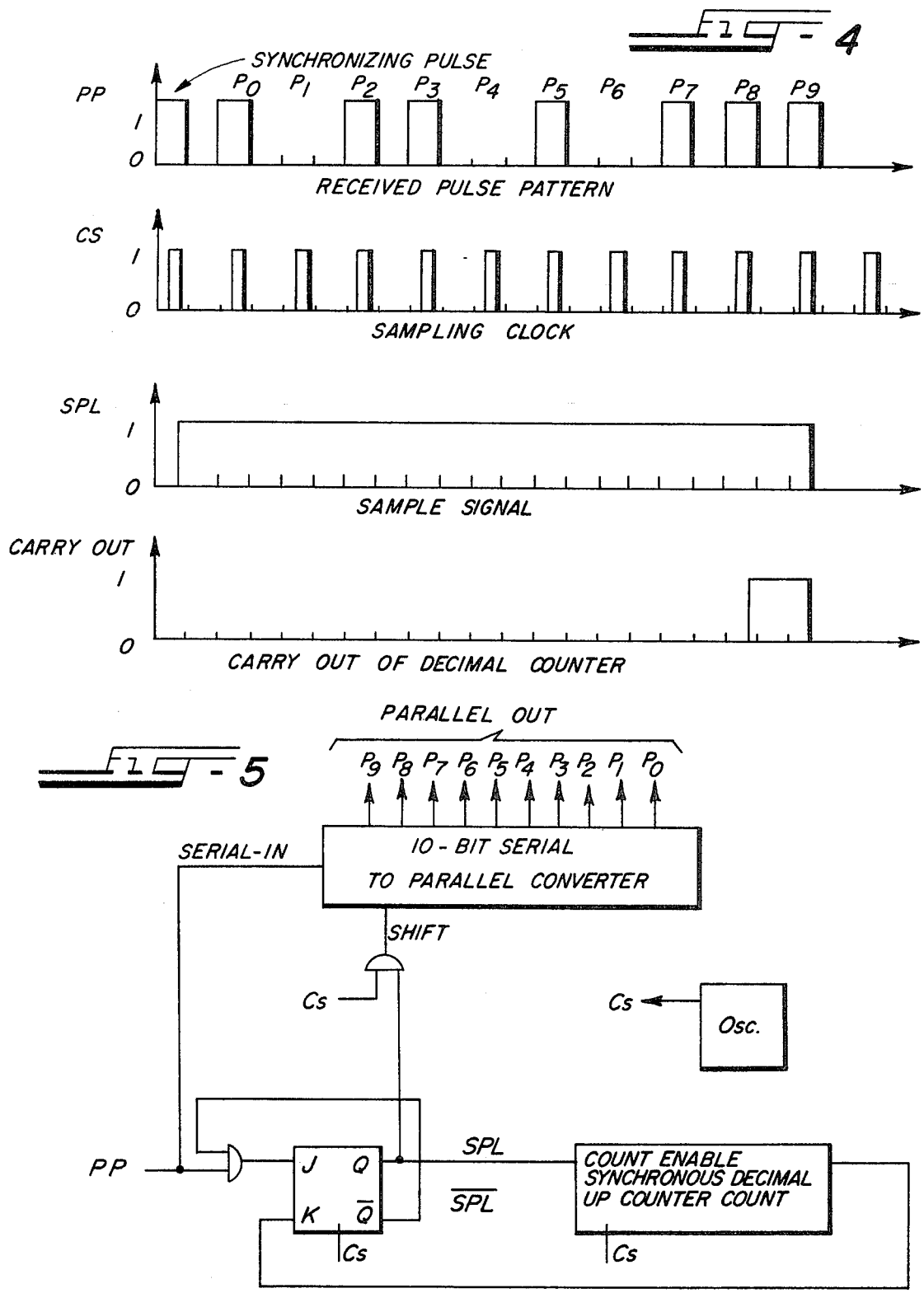

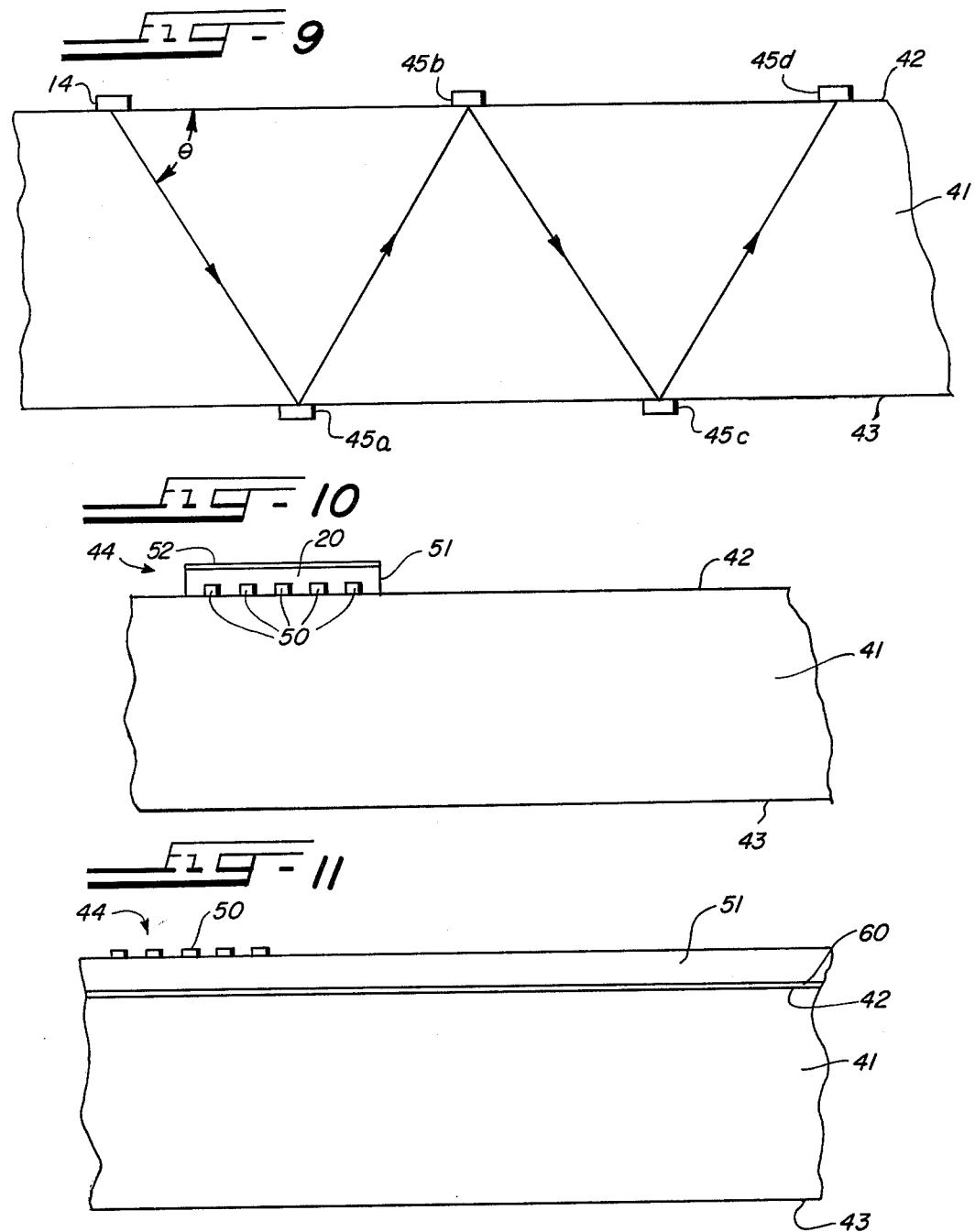

IDENTIFICATION SYSTEM USING CODED PASSIVE TRANSPONDERS

This application is a continuation-in-part of co-pending applications Ser. No. 725,195 filed Sept. 21, 1976 for MICROACOUSTIC SHEAR BULK WAVE DEVICE, and Ser. No. 617,251 filed Sept. 29, 1975 now Pat. No. 4,059,831 for PASSIVE TRANSPONDERS USING ACOUSTIC SURFACE WAVE DEVICES.

BACKGROUND OF THE INVENTION

Passive identifiers capable of producing coded replies are known in the prior art. For example, in Cole et al. U.S. Pat. No. 3,706,094 issued Dec. 12, 1972 there is shown an electronic surveillance system including a label in the form of a surface acoustic wave device. Labels are coded by maufacturing cards with a full array of elements and by later severing the connections of an appropriate number of array elements from the main transmission line. Alternatively, labels manufactured in accordance with the Cole et al. patent may be coded during manufacture by omitting one or more array elements or by not connecting them to the transmission line.

Surveillance systems manufactured in accordance with the Cole et al. patent suffer from the disadvantage that severance of the connections of array elements from a transmission line is difficult to perform manually because of the small size of such elements. Labels coded during manufacture by omission or disconnection of elements lack the flexibility of labels coded by an ultimate use because severance of elements renders these labels incapable of replying with certain codes utilizing the severed elements. The Cole et al. labels suffer from the additional disadvantage that they are based upon surface wave devices, in which losses are extremely high compared with shear bulk wave devices.

It is a principal object of the present invention to provide an identification system having an identifier that may be coded manually by the ultimate user by imposing pressure upon a pad means intermediate an input transducer and an output transducer to interrupt communication between the transducers, and by removing pressure from the pad means to restore such communication. Because output transducers may be reconnected after they have been disconnected, the identification system of the invention is more flexible in varying codes than prior art systems in which output transducers are permanently disconnected from a delay line.

Another object of the invention is to produce an identification system having an identifier which is a microacoustic shear bulk wave device, thereby minimizing losses occurring during processing and increasing the maximum number of useful output transducers so that a larger number of different coded electronic replies may be produced in response to an electromagnetic signal.

Additional objects and advantages of the present invention will become apparent to persons skilled in the art from the following specification, taken in conjunction with the drawings.

BRIEF DESCRIPTION OF THE DRAWINGS

FIG. 4 is a schematic illustration of four different signals required for operation of the synchronous pattern receiver;

FIG. 5 is a schematic block diagram of the operations performed by a synchronous pattern receiver of the invention;

FIG. 9 is a schematic illustration of a microacoustic shear bulk wave identifier of the invention;

FIG. 10 is a schematic illustration of one embodiment of an input transducer of a microacoustic shear bulk wave identifier of the invention; and FIG. 11 is a schematic illustration of a second embodiment of an input transducer of a microacoustic shear bulk wave identifier of the invention.

BRIEF DESCRIPTION OF THE INVENTION

The present invention is practiced by transmitting a radio frequency pulse through an antenna to a coded passive transponder identifier. The radio pulse is then processed acoustically in the identifier, and a coded reply signal is retransmitted by the identifier. The reply signal is received in a decoding subsystem, processed by conversion to a string of digital pulses, and compared with stored information to determine whether a bearer of the identifier should be allowed access or other action taken.

Figure 1:
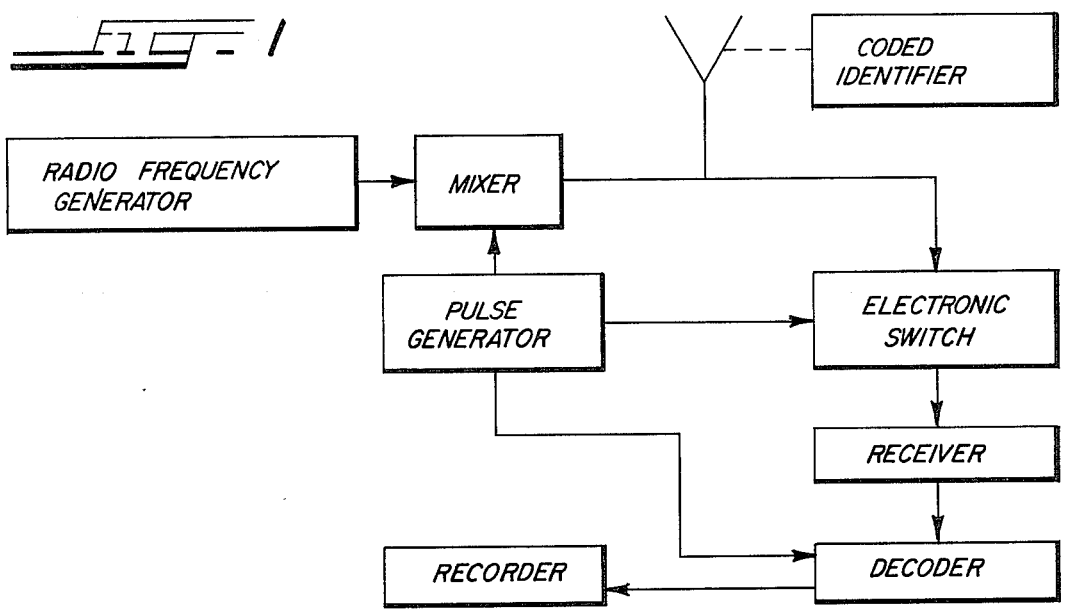
FIG. 1 is a schematic block diagram of an identification system including a coded passive transponder identifier of the invention.

A schematic block diagram of an identification system of the invention is shown in FIG. 1. The pulse generator, radio frequency generator, and mixer are components of a transmitter. The radio frequency generator includes a standard radio frequency (e.g. 200 megahertz) oscillator and amplifier connected to an antenna through a mixer. The mixer allows the pulse generator to modulate the radio frequency generator so that bursts of radio waves are transmitted through the antenna. The duration and periodicity of such bursts are controlled by the pulse generator. For example, the electromagnetic signal produced at the transmitting antenna may be a burst one microsecond in duration at a carrier frequency of several hundred megahertz with a repetition rate in the kilohertz region.

The transmitted electromagnetic signal is detected nearly instantaneously at the coded identifier which is held in proximity to the antenna. This identifier is a passive transponder which is coded to give a characteristic reply signal. The transponder has a small antenna of its own. The electromagnetic signal detected by the transponder antenna is converted into an acoustic signal by an input transducer. Several output transducers receive this acoustic signal during the delay period and the delayed acoustic signal is reconverted into an electromagnetic pulsed radio frequency signal at time intervals determined by location of the transducers on the transponder. This signal is then retransmitted by the transponder antenna and detected by a receiving antenna. The receiving antenna may be separate from the transmitting antenna or the same antenna may be used for both transmitting and receiving, as shown in FIG. 1. This system of a common antenna for both transmitted and received electromagnetic signals is well known in the field of radar.

The received signal consists of a train of radio frequency pulses, their number being dependent upon the number of output transducers in the device and their time interval determined by the location of such output transducers. For example, for every pulse originally received by the transponder at a rate of one kilohertz (i.e. once every millisecond), there will be detected at the receiver a train of pulses spaced about a microsecond apart with their precise number varying from about 10 to 100 depending upon size of the device and the total number of output transducers.

The signal arriving at the receiving antenna consists of two parts. The antenna will receive the unmodified, high-energy transmitted radio frequency burst. In addition, the signal modified and retransmitted by the transponder will also be received. An electronic switch is provided to attenuate the transmitted high-energy signal in synchronism with the pulse generator so that the high-energy signal does not saturate the receiver.

Figure 2:
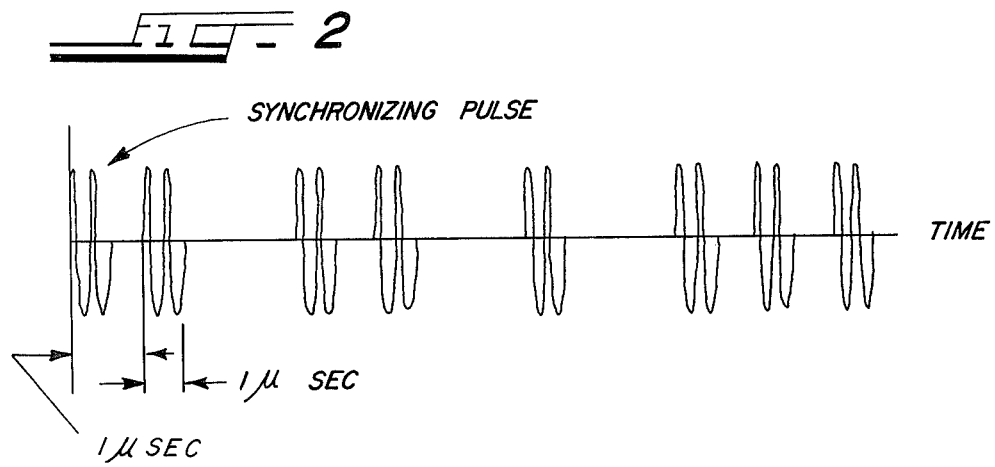
FIG. 2 is a schematic illustration of the output of an electronic switch for the binary code pattern 1011010111.

The output of the electronic switch is a radio frequency pulse train. It has a periodicity equal to the frequency of the pulse generator and consists of a radio frequency pulse coincident with the transmitted burst, followed by a number of pulses whose number is dependent upon the number of output transducers in the coded transponder. The output of the electronic switch is illustrated schematically in FIG. 2.

For decoding purposes it is necessary to know the frequency and maximum number of pulses in the pulse train. Assuming for purposes of illustration that the maximum number of pulses is fixed at 10 and that the pulses occur at evenly spaced intervals (e.g. 2 microseconds), there exist $2^{10} = 1024$ unique binary code patterns which may be designed into the transponder. Therefore, 1024 different transponders can be fabricated, each having a different code pattern.

Figure 3:
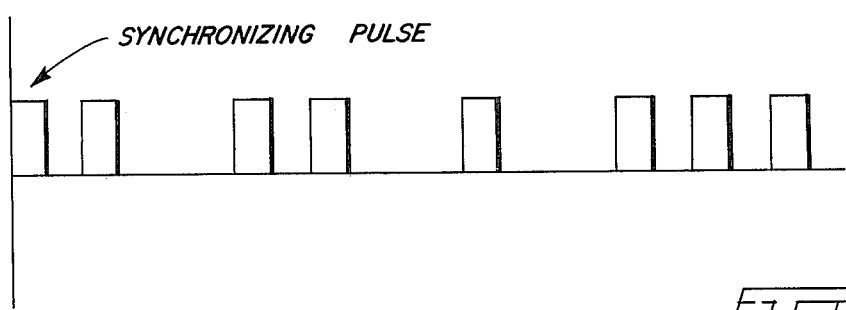
FIG. 3 is a schematic illustration of the output of a receiver for the binary code pattern 1011010111.

The receiver is a standard radio frequency receiver which detects pulses and converts them into logic level computable signals, preserving the pattern and spacing of the pulses. Output of the receiver for the binary code pattern 1011010111 is illustrated schematically in FIG. 3.

Once received, the pulse train is amplified and detected to provide a repeated train of a video pulse pattern. This pulse pattern is matched in the decoder with a number of stored pulse patterns for appropriate identification and recording.

The decoder monitors received pulse patterns, identifies them, optionally records each pattern, and answers queries. For example, in a limited access system the bearer of a transponder may or may not perform some other function according to the code pattern generated by his transponder. The decoder will answer with a yes or no regarding the bearer's ability to access an area or another system. The decoder includes two components: a synchronous pattern receiver and an analyzer.

The synchronous pattern receiver monitors the receiver output and converts the time serial pattern received into a parallel pattern using a serial-to-parallel converter.

The signals illustrate schematically in FIG. 4 are used in the synchronous pattern receiver. Processing of these signals is explained with reference to FIG. 5. The pulse pattern (PP) will be at logic 0 prior to arrival of the synchronizing pulse as will be the sampling signal (SPL). A sampling clock (CS) runs in synchronism with PP at 0.5 megahertz. The time at which CS is logic is centered at the middle of the received pulses and of shorter duration (e.g. ± 250 nanoseconds). When the synchronizing pulse is received, SPL (the output of the J-K master/slave flip/flop) is set to logic 1. This enables the decimal counter to begin counting and simultaneously, through the feedback of $\overline{SPL}$ into the AND gate at the J input, allows SPL to be reset 10 clock periods later using the carry out of the decimal counter.

The signal SPL can be used to sample PP and store the received pulse pattern, without the synchronizing pulse, in the serial-to-parallel converter. In addition, SPL can be used to indicate that a valid pattern (i.e. not being sampled) is present in the serial-to-parallel converter.

This received pattern $P = P_9 P_8 \ldots P_1 P_0$, can be displayed, recorded, (on computer or human readable output) or transmitted directly to a computer for analysis.

Figure 6:
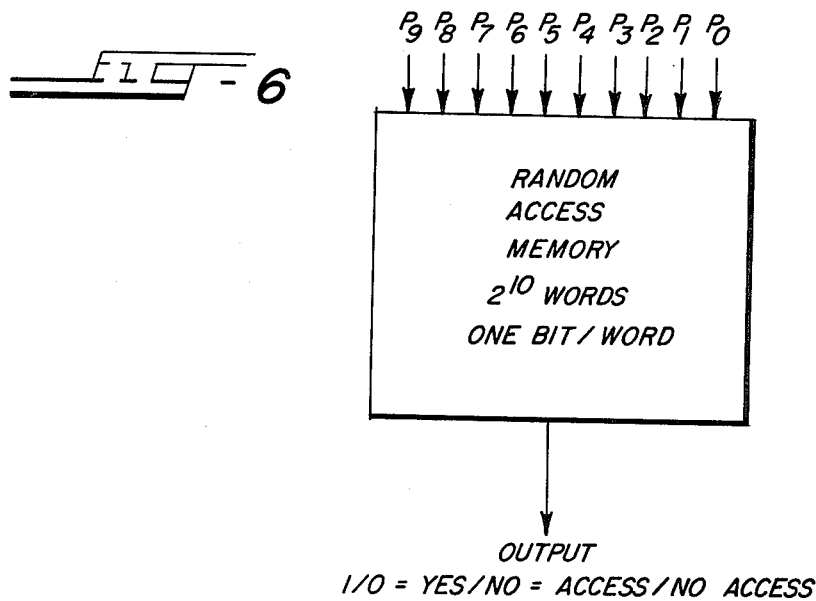
FIG. 6 is a schematic block diagram of the operation of an analyser of the invention.

An analyzer is provided to give a yes or no (logic 1 or 0) for each pattern received, as shown in FIG. 6. (Note: we assume throughout that $P = 000 \ldots 00$ is an invalid pattern since it will be produced in the absence of a transponder). While any type of combinational logic could be designed to produce this answer, the simplest is the most universal, namely a random access memory. Assume the memory has $2^{10}$ one-bit words. In each word is stored a logic one or zero. The pattern P can be used as an address to produce the value of the word thus producing a logic 1 or 0 for each of the possible patterns, as shown in FIG. 6.

This logic 1 or 0 can be used to allow or deny access to the card bearer or to permit or not permit him to perform any functions.

With this formulated technique in mind several other options become available. For example, if 2 bit words are used, $2^2 = 4$ categories of answers are available. These could be assigned to be permission granted, permission not granted, invalid or stolen card, card not issued. The last two categories would be useful for retrieving stolen or lost cards.

Generally speaking, most analyzers would use read-only memory (ROM) for non-votability in the absence of power. If this is the case, the $nt$ pattern for each category would be relatively fixed. However, field-programmable read-only memories (PROM) could be used giving the owner of the analyzer the ability to modify the category to which any card belongs in the event of stolen or lost cards or change of access privileges.

Finally all of the above can be accomplished through the use of programmable logic arrays (PLA) or field programmable logic arrays (FPLA) in which case fewer than $2^{10}$ words need be used but with the same number of bits per word. Of course, any pattern not programmed would give a no answer to the query.

A preferred embodiment of a surface acoustic wave identifier of the invention is described with reference to FIG. 7. The identifier 20 includes a surface acoustic wave delay line 21 imprinted on a piezoelectric substrate 22 approximately the same size as a credit card. A radio signal emitted by a transmitter (not shown) is received by a receiving antenna or first antenna means 23 and applied to an input transducer 24. The delay line also includes five linearly arranged output transducers 25a, 25b, 25c, 25d, 25e connected to a retransmitting antenna or second antenna means 30. Optionally and preferably, the receiving antenna 23 and retransmitting antenna 30 may be combined into a single antenna, as shown in FIG. 8.

In the preferred embodiment illustrated the transducers 24, 25 are metal interdigital electrodes etched upon the surface of a quartz substrate 22. The input transducer 24 converts a received radio frequency signal into a surface acoustic wave of the same frequency but of greatly reduced (100,000 times) wavelength as compared with electromagnetic waves. For a basic clock frequency of 70 megahertz, electrodes within each transducer are spaced apart a distance of 0.0238 mm. This is one-half the wave length of a 70 megahertz wave on the quartz surface.

Surface acoustic waves generated by the input transducer 24 propagate along the delay line 21. In the preferred embodiment shown in FIG. 7 the delay line 21 is provided with five rubber pads or pad means 35a, 35b, 35c, 35d, 35e, corresponding to each of the five output transducers 25a, 25b, 25c, 25d, 25e. These rubber pads 35 are used to apply pressure in zones between the individual output transducers 25, thereby disrupting transmission of surface acoustic waves distal to the zone in which pressure has been applied. In the preferred embodiment illustrated in FIG. 7 pressure has been applied to the middle pad 35c, thereby preventing transmission of a surface acoustic wave to the three output transducers 25c, 25d, 25e, located distally of the middle pad 35c. This results in emission of the binary reply code pattern 11000 by the delay line 21 and retransmission antenna 30.

The reply code pattern thus retransmitted is picked up by a remote receiver (not shown) for further processing, as described above by reference to FIG. 1. When pressure is removed from any given pad, communication is restored between the input transducer 24 and output transducers 25 located distally of that pad 35. It is readily apparent that the pad means 35 constitute programming means by which the reply code pattern of the delay line 21 may be modified manually without resort to any electrical connections.

Figure 7:
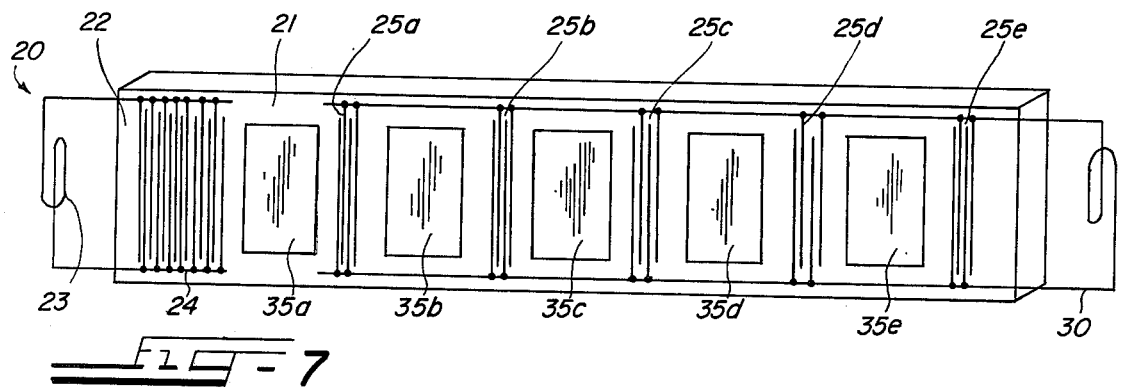
FIG. 7 is a schematic perspective view of a coded surface acoustic wave passive transponder identifier of the invention.
Figure 8:
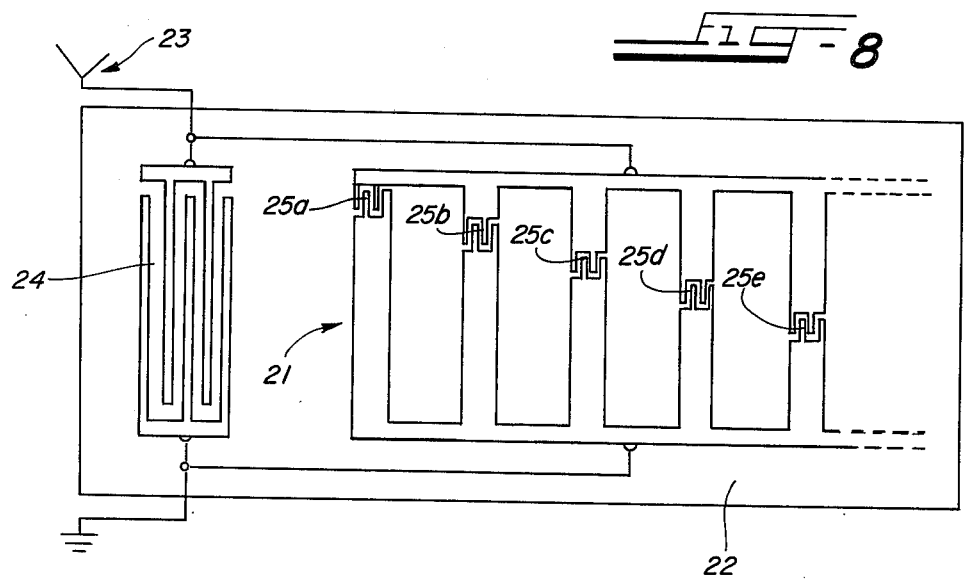
FIG. 8 is a schematic view of a modified coded surface acoustic wave passive transponder identifier of the invention.

Even though the input signal and the output reply may utilize separate antennas, it is likely that interaction will occur between the received and transmitted signals when the input and output transducers are arranged as shown in FIG. 7. Hence the output transducers 25 will inevitably generate surface acoustic waves propagating in both directions along the substrate 22. Such interaction materially restricts the number of available codes.

An arrangement by which this objectionable interaction may be eliminated is shown in FIG. 8. As depicted schematically, an input transducer 24 is provided with a very large aperture and the output transducers 25 are each several times smaller. Because surface acoustic waves are generated perpendicular to the parallel electrodes along the delay line 21, and because the output transducers are positioned in a staggered array to avoid interaction with surface acoustic waves generated by other output transducers, there is no interaction between the output transducers 25. This avoids reduction in the number of available code patterns. The output coded reply pattern is retransmitted through the antenna 23.

A second embodiment of an identifier of the invention is illustrated in FIG. 9. This identifier is a microacoustic shear bulk wave device 40 including an ST quartz substrate 41 having a principal surface 42 and an opposed, parallel second surface 43. Both surfaces 42, 43 are smooth, polished surfaces in the preferred embodiment shown.

An input interdigital transducer 44 is supported on the principal surface 42, and output transducers 45a, 45b, 45c, 45d spaced at intervals along the principal and second surfaces, as illustrated. This device is coded by omitting or disconnecting output transducers, or by substituting rubber pressure pads (not shown) for one or more of the output transducers 45.

In this bulk device 40 the input transducer 44 includes interdigital aluminum electrode pairs 50 etched upon the principal surface 42, as shown in FIG. 10. A 6.4 micron thickness layer 51 of RF sputtered ZnO lies over the transducer electrodes 50. Other piezoelectric substances such as aluminum nitrate may be substituted for the ZnO layer.

A thin layer 52 of conducting aluminum is deposited over the ZnO layer 51. This film 52 must be sufficiently thin to avoid excessive mechanical loading of the ZnO layer. In the preferred embodiment illustrated this aluminum film 52 has a thickness of about 0.1 micron.

A second type of microacoustic shear bulk wave identifier is illustrated in FIG. 11. Here a thin conductive aluminum plane 60 is interposed between the principal surface 42 and ZnO layer 51. Interdigital aluminum electrodes 50 are deposited over the ZnO layer 51.

At boundaries represented by polished surfaces 42, 43 of the substrate 41, the shear bulk wave is reflected and continues along a bouncing path indicated in FIG. 9. The distance between the input transducer 44 and the most distal output transducer 45d in FIG. 9 is 5.08 mm. The output transducers 45a, 45b, 45c, 45d are identical in structure to the input transducer 44.

The shear bulk wave is propagated at an angle $\theta$ to the principal surface 42. This angle $\theta$ varies, depending upon thickness of the ZnO layer and periodicity of the input transducer 44. In the preferred embodiment described herein and illustrated in FIGS. 9 and 10, $\theta = 58.3°$.

It should be noted that the function of the ST quartz in the substrate 41 is to provide a substrate with small dispersion or beam spreading over a wide frequency range. The fact that ST quartz is crystalline and piezoelectric is only incidental and plays no role in transduction. A similar device has been constructed with a substrate of fused quartz, which is neither crystalline nor piezoelectric. It is believed that most homogeneous substances, including glass, will perform as an effective substrate in a microacoustic shear bulk wave device.

While the foregoing invention has been described by reference to several preferred embodiments, it will be understood that numerous changes and modifications therein may be made without departing from the spirit and scope of the invention.

What is claimed is:
1. An identification system comprising
transmitter means for transmitting an electromagnetic signal;
a passive surface acoustic wave identifier adapted to produce a coded electronic reply in response to an electromagnetic signal, comprising a piezoelectric substrate, an input transducer carried by the piezoelectric substrate, a plurality of output transducers carried by the substrate and spaced from said input transducer at preselected intervals, and programming means for programming said output transduc- ers to emit an electronic reply having a preselected sequential time order in response to a surface acoustic wave propogated by said input transducer, said programming means comprising pad means overlying said substrate in a zone intermediate said input transducer and an output transducer, whereby pressure applied to said substrate through said pad means renders said substrate non-conductive to a surface acoustic wave in said zone, thereby rendering any output transducer spaced distally of said pad means unresponsive to a surface acoustic wave propagated by said input transducer, and producing a preselectable variation in the coded electronic reply of said output transducers responsive to an electromagnetic signal;

receiver means for receiving said coded electronic reply; and decoder means for matching the coded electronic reply of said identifier with stored coded pulse patterns.

2. An identification system comprising transmitter means for transmitting an electromagnetic signal;

a passive microacoustic shear bulk wave identifier adapted to produce a coded electronic reply in response to an electromagnetic signal, said identifier comprising a substrate having a principal surface and a polished second surface opposed to said principal surface; an input transducer supported on the principal surface and comprising a plurality of electrodes, a piezoelectric layer adjacent said electrodes, and a conductive film adjacent said piezoelectric layer; and a plurality of output transducers situated adjacent the substrate at preselected locations corresponding to a code, whereby said output transducers emit a coded electronic reply having a preselected sequential time order in response to a microacoustic shear bulk wave propagated by said input transducer;

receiver means for receiving said coded electronic reply; and decoder means for matching the coded electronic reply of said identifier with stored coded pulse patterns.

3. The identification system of claim 2, wherein said substrate is ST quartz.

4. The identification system of claim 2, wherein said piezoelectric layer comprises ZnO.

5. The identification system of claim 2, wherein said conductive film is an aluminum film.

6. The identification system of claim 2, wherein said input transducer comprises a plurality of electrodes supported on the principal surface, a piezoelectric layer overlying said electrodes, and a conductive film overlying said piezoelectric layer.

7. The identification system of claim 2, wherein said input transducer comprises a conductive plane overlying said principal surface of the substrate, a piezoelectric layer overlying said conductive plane, and a plurality of interdigital electrodes supported on said piezoelectric layer.

8. The identification system of claim 2, wherein said substrate is a non-piezoelectric substance.

9. The identification system of claim 8, wherein said non-piezoelectric substance is glass.

10. The identification system of claim 2, and further comprising first antenna means connected to said input transducer, and second antenna means connected said output transducer.

11. The ientification system of claim 10, wherein said first and second antenna means constitute a single antenna.

12. The identification system of claim 2 wherein surface acoustic waves emanating from each said output transducers define a path along the surface of said substrate, and each said output transducers is positioned adjacent said substrate out of the path of surface acoustic waves generated by all other of said output transducers, thereby obviating any reduction of available coded electronic reply patterns produced by said identifier in response to an electromagnetic signal.

13. A passive microacoustic shear bulk wave identifier adapted to produce a coded electronic reply in response to an electromagnetic signal, comprising a substrate have a principal surface and a polished second surface opposed to said principal surface, an input transducer supported on the principal surface and comprising a plurality of electrodes, a piezoelectric layer adjacent said electrodes, and a conductive film adjacent said piezoelectric layer, and a plurality of output transducers situated adjacent the substrate at preselected locations corresponding to a code, whereby said output transducers emit a coded electronic reply having a preselected sequential time order in response to a microacoustic shear bulk wave propagated by said input transducer.

* * * * *